United States Patent
Sun (10) Patent No.: US 9,494,984 B1
(45) Date of Patent: Nov. 15, 2016

(54) FIXING STRUCTURE OF REMOVABLE ELECTRONIC DEVICE

(71) Applicants: LITE-ON ELECTRONICS (GUANGZHOU) LIMITED, Guangzhou (CN); LITE-ON TECHNOLOGY CORPORATION, Taipei (TW)

(72) Inventor: Wei-Chih Sun, Taipei (TW)

(73) Assignees: LITE-ON ELECTRONICS (GUANGZHOU) LIMITED, Guangzhou (CN); LITE-ON TECHNOLOGY CORPORATION, Taipei (TW)

( * ) Notice: Subject to any disclaimer, the term of this patent is extended or adjusted under 35 U.S.C. 154(b) by 0 days.

(21) Appl. No.: 14/954,637

(22) Filed: Nov. 30, 2015

(30) Foreign Application Priority Data

Jun. 30, 2015 (CN) .................. 2015 2 0466042 U (51) Int. Cl.
 *G06F 1/16* (2006.01)
 *G06F 1/18* (2006.01)
 *F16M 13/06* (2006.01)

(52) U.S. Cl.
 CPC ............ *G06F 1/187* (2013.01); *F16M 13/06* (2013.01)

(58) Field of Classification Search
 CPC ................................ G06F 1/185; G06F 1/187

USPC .............. 248/682, 309.1; 361/679.4, 679.33, 361/679.37; 403/345

See application file for complete search history.

(56) References Cited

U.S. PATENT DOCUMENTS

| | | | |
|---|---|---|---|
| 7,874,303 B2* | 1/2011 | Xie ...................... | E04H 15/46 135/120.3 |
| 9,138,898 B2* | 9/2015 | Liu ..................... | B25J 15/0616 |
| 9,313,913 B2* | 4/2016 | Jimenez, III ....... | H01R 12/7005 |
| 2009/0316346 A1* | 12/2009 | Sun ........................ | G06F 1/185 361/679.4 |
| 2011/0128693 A1* | 6/2011 | Zhang .................. | G06F 1/187 361/679.33 |

* cited by examiner

*Primary Examiner* — Todd M Epps
(74) *Attorney, Agent, or Firm* — Li & Cai Intellectual Property (USA) Office (57) ABSTRACT

A fixing structure of a removable electronic device adapted for fixing an electronic device to a bay includes a handle body, a backplane, a screw member, and an elastic member. The handle body has front and rear faces, the front face is formed with an opening, and the opening is formed with a stopping mechanism. The backplane is disposed at the rear face of the handle body, the backplane is formed with a perforation, and the perforation corresponds to the opening. The screw member is disposed inside of the handle body, the screw member is stopped by the stopping mechanism, and the screw member extends passing through the backplane via the perforation. The elastic member is disposed between the screw member and the backplane. The backplane is fixed at the electronic device, the screw member is connected to the bay, and the electronic device is fixed to the bay.

10 Claims, 7 Drawing Sheets

FIXING STRUCTURE OF REMOVABLE ELECTRONIC DEVICE

BACKGROUND OF THE INVENTION

1. Field of the Invention

The instant disclosure relates to a fixing structure of a removable electronic device; in particular, to a fixing structure of a removable electronic device which can be disposed outside of the electronic device and is easy to remove and change.

2. Description of Related Art

Conventional disk drive arrays can be applied to server systems. In order to easily fix the disk drive arrays, two holder devices are respectively disposed at two sides of the front end of the disk drive array having an outer casing, and the disk drive array can be removed and changed using the two holder devices. The conventional holder device has holding and fixing functions, and includes a base body and a holder. The holder can be rotatably pivoted on the base body. The base body is disposed with a combined screw, a floating screw, a screw sleeve, or a hand turn screw, that can be used to screwedly connect to the bay, and the disk drive array is fixed to the bay. However, the abovementioned holder device needs to be disposed with complex components for holding in place and for fixing the unit, the structure is complicated to manipulate, and the manufacturing cost is increased.

For such reasons as above, the inventor of this instant disclosure has contributed to research and developed the fixing structure of the removable electronic device of the instant disclosure to overcome the abovementioned drawbacks.

SUMMARY OF THE INVENTION

The technical problem need to be solved by this instant disclosure is that, this instant disclosure provides a fixing structure of a removable electronic device, which does not need to be disposed with complex components but can achieve holder and fixing functions, the structure is simplified to significantly reduce the cost of manufacturing, and it is easy to operate.

In order to overcome the abovementioned problems, the instant disclosure provides a fixing structure of a removable electronic device adapted for fixing an electronic device to a bay, which includes a handle body, a backplane, a screw member, and an elastic member. The handle body has a front face and a rear face, the front face is formed with an opening, and the opening is formed with a stopping mechanism. The backplane is disposed at the rear face of the handle body, the backplane is formed with a perforation, and the perforation corresponds to the opening. The screw member is disposed inside of the handle body, the screw member is stopped by the stopping mechanism, and the screw member is extended passing through the backplane via the perforation. The elastic member is disposed between the screw member and the backplane. The backplane is fixed at the electronic device, the screw member is connected to the bay, and the electronic device is fixed to the bay.

Preferably, an inner edge of the opening is formed with a protrusion part, and the protrusion part is formed as the stopping mechanism.

Preferably, the inner edge of the opening is formed with a step part, and the step part is formed as the stopping mechanism.

Preferably, a side face is disposed at an outer edge of the handle body, the side face is located between the front face and the rear face, and the side face is formed with a handle space.

Accordingly, this instant disclosure has the following benefits:

The fixing structure of the instant disclosure includes a handle body, a backplane, a screw member, and an elastic member, the backplane is fixed to the electronic device, the screw member is screwedly connected to the bay, and the electronic device can be removably fixed to the bay. The instant disclosure does not need to be disposed with complex components but can achieve holding and fixing functions, the structure is simplified to significantly reduce the cost of manufacturing, and it is easy to operate and is convenient.

In order to further appreciate the characteristics and technical contents of the present invention, references are hereunder made to the detailed descriptions and appended drawings in connection with the instant disclosure. However, the appended drawings are merely shown for exemplary purposes, rather than being used to restrict the scope of the instant disclosure.

DETAILED DESCRIPTION OF THE PREFERRED EMBODIMENTS

First Embodiment

Figure 1:
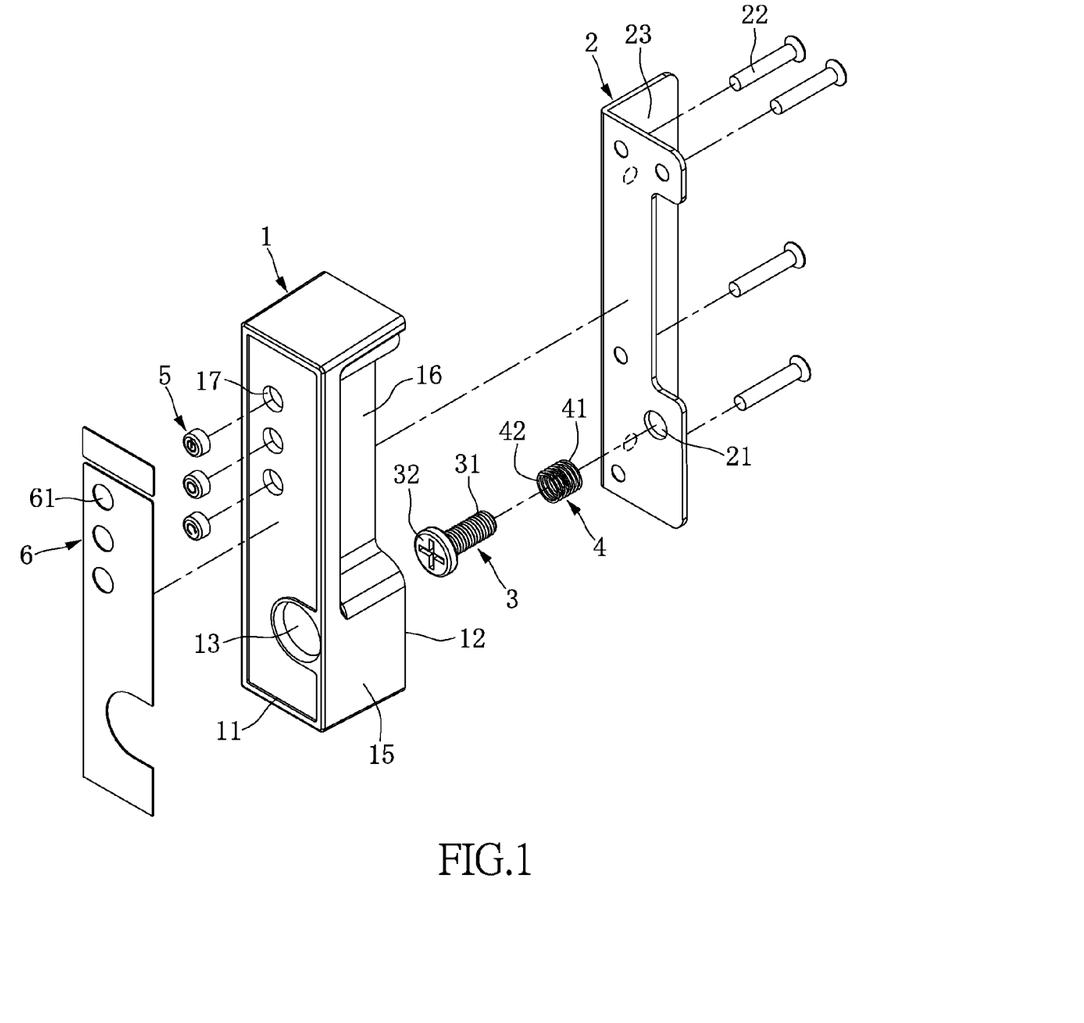
FIG. 1 shows a perspective exploded schematic view of a fixing structure of an electronic device of a first embodiment in the instant disclosure.
Figure 2:
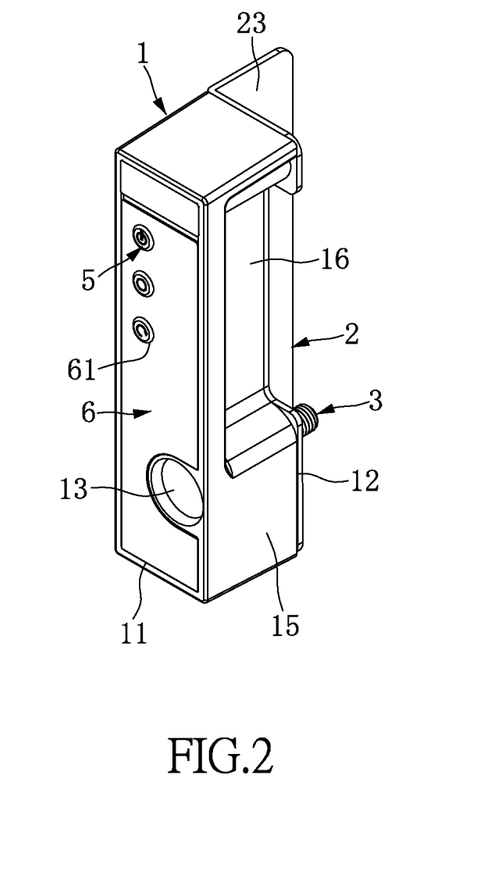
FIG. 2 shows a perspective view of the fixing structure of the electronic device of the first embodiment in the instant disclosure.
Figure 3:
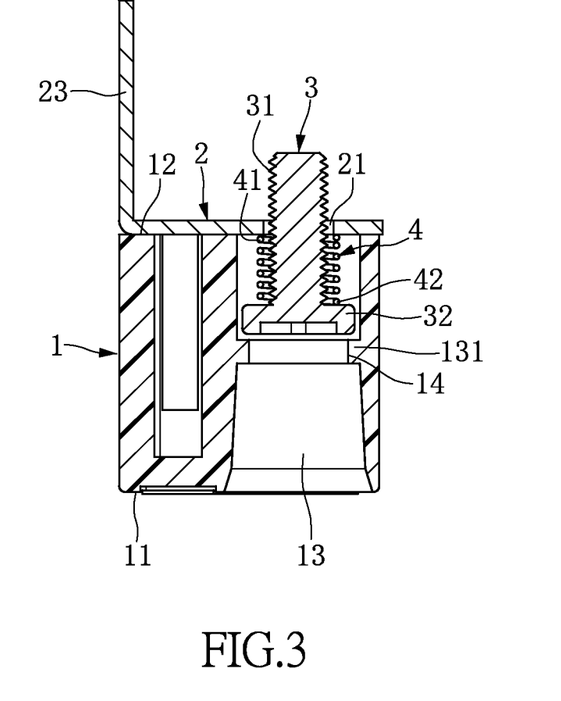
FIG. 3 shows a cross-sectional view of the fixing structure of the electronic device of the first embodiment in the instant disclosure.
Figure 4:
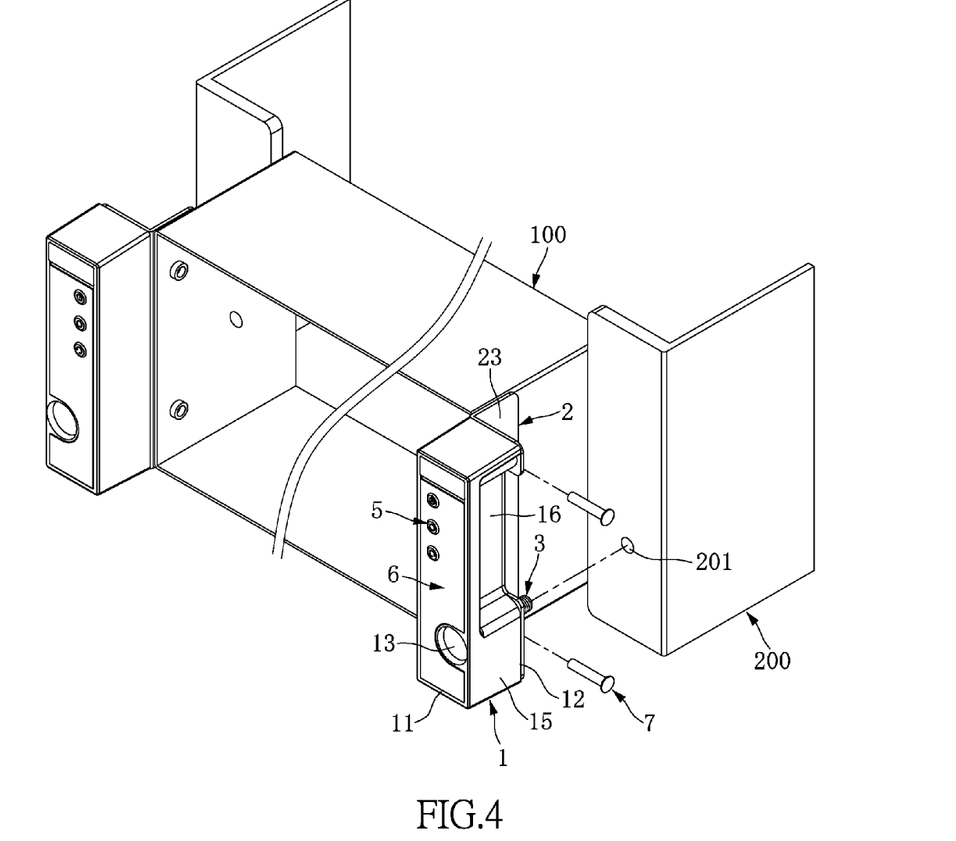
FIG. 4 shows a schematic view (1) of the fixing structure of the electronic device in use state of the first embodiment in the instant disclosure.
Figure 5:
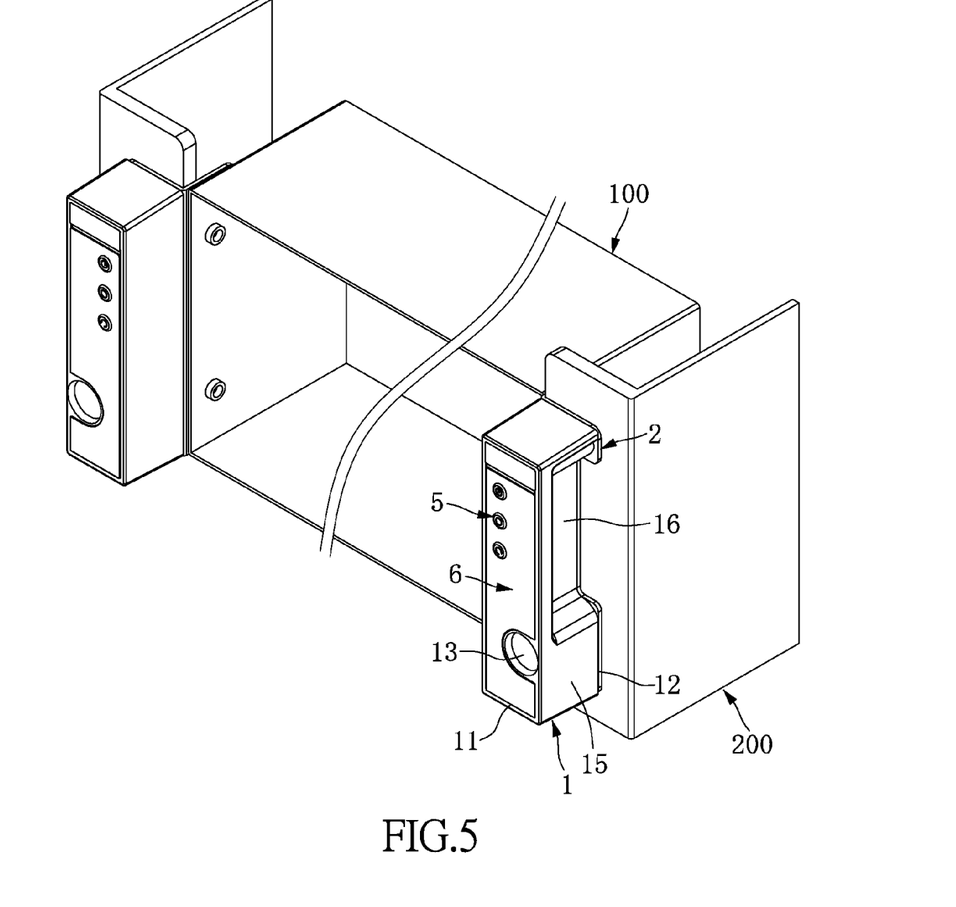
FIG. 5 shows a schematic view (2) of the fixing structure of the electronic device in use state of the first embodiment in the instant disclosure.

Please refer to FIGS. 1 to 3. This instant disclosure provides a fixing structure of a removable electronic device adapted for fixing an electronic device 100 to a bay 200 (as shown in FIGS. 4 and 5), the electronic device 100 can be a disk drive array (the figure only shows an outer case of the electronic device), but it is not limited herein. The fixing structure includes a handle body 1, a backplane 2, a screw member 3, and an elastic member 4.

The handle body 1 can be made of a material such as a plastic material or a metal material, a shape of the handle body is not limited herein. In this embodiment, the handle body 1 is substantially rectangular in shape. The handle body 1 has a front face 11 and a rear face 12, the front face 11 and the rear face 12 are located at two opposite surfaces of the handle body 1. The front face 11 is formed with an opening 13, the opening 13 can be a circular hole, and the opening 13 can be inwardly extended an appropriate length and pass through the rear face 12, so that two ends of the opening 13 have open shapes.

The opening 13 is formed with a stopping mechanism 14 to stop the screw member 3, so as to avoid the screw member 3 being separated from the handle body 1 through the opening 13. In this embodiment, an inner diameter of the opening 13 is larger than or equal to an outer diameter of the screw member 3, an inner edge of the opening 13 is formed with a protrusion part 131, the protrusion part 131 can be surroundingly disposed at the inner edge of the opening 13 in a continuous or intervalic manner, and the protrusion part 131 is formed as the stopping mechanism 14 to stop the screw member 3. The protrusion part 131 can be disposed at the inner edge of the opening 13 in one piece or in a combination manner.

A side face 15 is disposed at an outer edge (four sides) of the handle body 1, the side face 15 is located between the front face 11 and the rear face 12, and the side face 15 is formed with a handle space 16, the handle space 16 can be concavely formed at the side face 15, so as to facilitate the user inserting a finger into and pulling the handle body 1. In another embodiment of the instant disclosure, the side face 15 also can be disposed with a convex structure such as a convex stick and a convex body, and the user also can easily pull the handle body 1.

The backplane 2 can be made of material such as metal or plastic, a shape of the backplane 2 substantially corresponds to the rear face 12 of the handle body 1, and the backplane 2 is disposed at the rear face 12 of the handle body 1. The backplane 2 is formed with a perforation 21, the perforation 21 can be a round hole, and the perforation 21 corresponds to the opening 13, that is, the perforation 21 can be disposed at a position corresponding to the opening 13. The backplane 2 can be fixed to the handle body 1 by locking, snapping, riveting, or bonding through a screw. In this embodiment, several fixing members 22 are used to run through the backplane 2 to be fixed to the handle body 1. The fixing members 22 can be screws, and the fixing members 22 are passed through the backplane 2 and screwedly fixed to the handle body 1, so as to facilitate the backplane 2 being screwedly fixed to the handle body 1. One side of the backplane 2 also can further vertically extend to form a connecting part 23, so as to facilitate fixing to the electronic device 100.

The screw member 3 is disposed inside of the handle body 1, that is, before the backplane 2 is fixed to the handle body 1, the screw member 3 is firstly disposed at the inside of the opening 13 of the handle body 1, and the screw member 3 can be stopped by the stopping mechanism 14. The screw member 3 can be disposed in a horizontal direction, and the screw member 3 can extend passing through the backplane 2 via the perforation 21, that is, the screw member 3 can extend throughout one surface of the handle body 1 backward to the backplane 2, so as to facilitate screwedly connecting to the bay 200. The type and configuration of the screw member 3 is not limited herein. In this embodiment, the screw member 3 has a threaded portion 31 and a head portion 32, the head portion 32 is connected to one end of the threaded portion 31, and the outer diameter of the head portion 32 is larger than the outer diameter of the threaded portion 31, and the threaded portion 31 of the screw member 3 can be extended passing through the backplane 2 via the perforation 21.

An elastic member 4 is disposed between the screw member 3 and the backplane 2, the elastic member 4 can be used to push the screw member 3 toward the front face 11 of the handle body 1 to return to its position, and the head portion 32 of the screw member 3 can be abutted against the stopping mechanism 14 to be positioned. When the screw member 3 is withdrawn to inside of the handle body 1 by the elastic member 4, the screw member 3 can be positioned in the opening 13 to avoid the screw member 3 being separated from the handle body 1 through the opening 13. The screw member 3 can be wholly or partly withdrawn to inside of the handle body 1. In this embodiment, the screw member 3 is partly withdrawn to inside of the handle body 1, and the threaded portion 31 of the screw member 3 is extended out of the backplane 2 under normal status. In this embodiment, the elastic member 4 is a pressing spring, and two ends of the elastic member 4 respectively abut against the backplane 2 and the head portion 32 of the screw member 3. That is, the elastic member 4 can have a first end portion 41 and a second end portion 42, and the first end portion 41 and the second end portion 42 respectively abut against the backplane 2 and the head portion 32 of the screw member 3. But, the configuration of the elastic member 4 is not limited herein, and the elastic member 4 also can be an elastic sheet or other types of elastic bodies that can push the screw member 3 to return to its position.

Several function buttons 5 can be further disposed on the front face 11 of the handle body 1, the function buttons 5 are disposed in a prearranged button space 17 of the front face 11, the function buttons 5 can be electrically connected to a circuit unit of the electronic device 100 by a wiring line, and the function buttons 5 can be pressed to perform their intended function. A panel 6 also can be further disposed on the front face 11 of the handle body 1, and the function buttons 5 and corresponding through holes 61 can also be disposed on the panel 6, so as to expose the function buttons 5.

Please refer to FIGS. 4 and 5. The backplane 2 of the fixing structure of this instant disclosure can be fixed to the electronic device 100, that is, one side of the backplane 2 extends to form the connecting part 23, and the connecting part 23 is fixed to one side of the electronic device 100 via several fixing components 7, such that the fixing structure of this instant disclosure can be fixed to the electronic device 100 (as shown in FIG. 4). In this way, the user can operate the handle body 1 to push the electronic device 100 to the bay 200 for positioning, and screw to connect the screw member 3 to the corresponding threaded hole 201 of the bay 200, so as to fix the electronic device 100 to the bay 200 (as shown in FIG. 5). On the contrary, by loosening the screw member 3, the screw member 3 can be pushed and withdrawn back inside of the handle body 1 using the elastic member 4. At this time, the user can operate the handle body 1 to remove the electronic device 100 from the bay 200.

Second Embodiment

Figure 6:
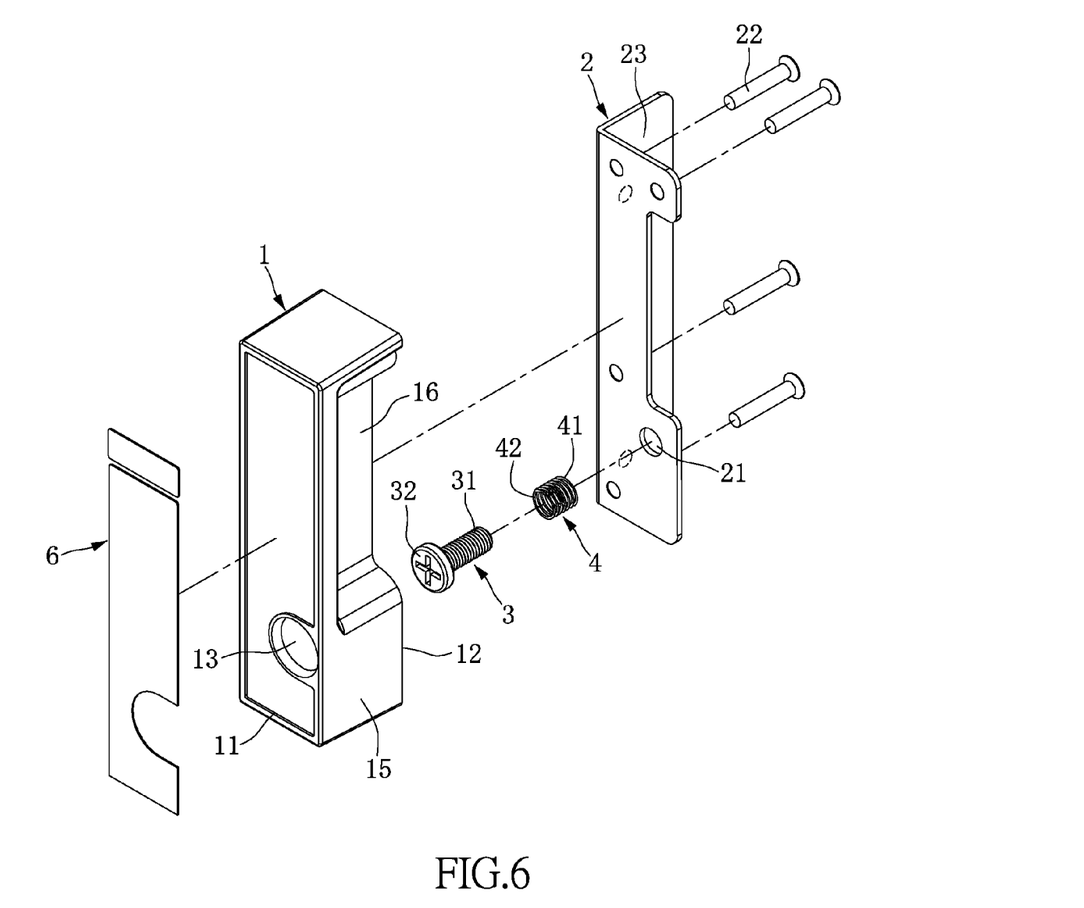
FIG. 6 shows a perspective view of the fixing structure of the electronic device of a second embodiment in the instant disclosure.

Please refer to FIG. 6. In this embodiment, the above-mentioned function buttons 5, button space 17, and through holes 61 are omitted.

Third Embodiment

Figure 7:
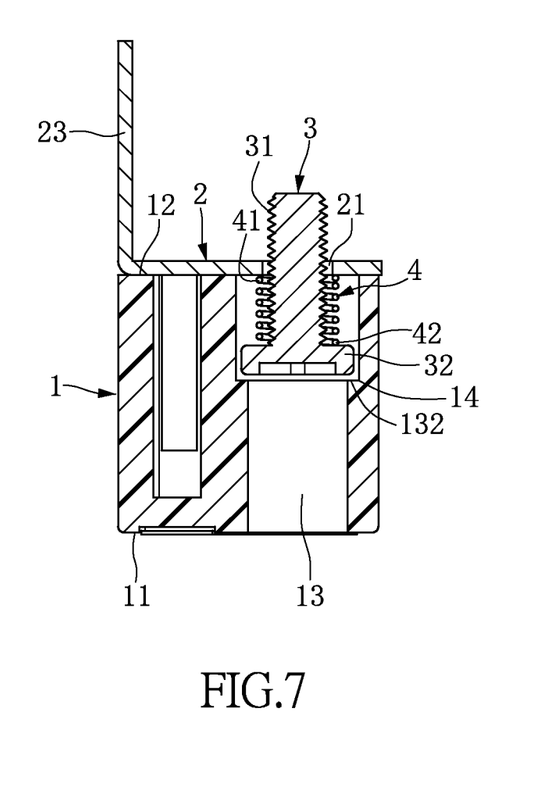
FIG. 7 shows a cross-sectional view of the fixing structure of the electronic device of a third embodiment in the instant disclosure.

Please refer to FIG. 7. In this embodiment, a part of the inner diameter of the opening 13 near the front face 11 is smaller than the outer diameter of the screw member 3, and the inner edge of the opening 13 is formed with a step part 132, and the step part 132 is formed as the stopping mechanism 14 which also can be used to stop the screw member 3.

The fixing structure of this instant disclosure includes the handle body, the backplane, the screw member, and the elastic member, the backplane is fixed to the electronic device, the screw member is screwedly connected to the bay, and the electronic device can be removably fixed to the bay. The instant disclosure does not need to be disposed with complex components but still can achieve holder and fixing functions, the structure is simplified to significantly reduce the cost of manufacturing, and it is easy to operate and is convenient.

The descriptions illustrated supra set forth simply the preferred embodiments of the present invention; however, the characteristics of the present invention are by no means restricted thereto. All changes, alterations, or modifications conveniently considered by those skilled in the art are deemed to be encompassed within the scope of the present invention delineated by the following claims.

What is claimed is:

1. A fixing structure of a removable electronic device adapted for fixing
an electronic device to a bay, comprising:
a handle body having a front face and a rear face, the front face formed with an opening, and the opening formed with a stopping mechanism;
a backplane disposed at the rear face of the handle body, the backplane formed with a perforation, and the perforation corresponding to the opening;
a screw member disposed inside of the handle body, the screw member being stopped by the stopping mechanism, and the screw member extended passing through the backplane via the perforation;
an elastic member disposed between the screw member and the backplane; and
the backplane fixed to the electronic device, the screw member connected to the bay, and the electronic device being fixed to the bay.

2. The fixing structure of the removable electronic device as claimed in claim 1, wherein an inner edge of the opening is formed with a protrusion part, and the protrusion part is formed as the stopping mechanism.

3. The fixing structure of the removable electronic device as claimed in claim 1, wherein the inner edge of the opening is formed with a step part, and the step part is formed as the stopping mechanism.

4. The fixing structure of the removable electronic device as claimed in claim 1, wherein a side face is disposed at an outer edge of the handle body, the side face is located between the front face and the rear face, and the side face is formed with a handle space.

5. The fixing structure of the removable electronic device as claimed in claim 1, wherein several fixing members are used to run through the backplane to be fixed to the handle body.

6. The fixing structure of the removable electronic device as claimed in claim 1, wherein the screw member has a threaded portion and a head portion, the head portion is connected to one end of the threaded portion, the threaded portion of the screw member is extended passing through the backplane via the perforation, and two ends of the elastic member respectively abut against the backplane and the head portion of the screw member.

7. The fixing structure of the removable electronic device as claimed in claim 1, wherein the elastic member is a pressing spring.

8. The fixing structure of the removable electronic device as claimed in claim 1, wherein several function buttons are disposed on the front face of the handle body.

9. The fixing structure of the removable electronic device as claimed in claim 1, wherein a panel is disposed on the front face of the handle body.

10. The fixing structure of the removable electronic device as claimed in claim 1, wherein one side of the backplane extends to form a connecting part, and the connecting part is fixed to the electronic device via several fixing components.

* * * * *